(12) United States Patent
Hwang et al.

(10) Patent No.: US 7,602,226 B1
(45) Date of Patent: *Oct. 13, 2009

(54) METHOD AND APPARATUS FOR CLOCK GENERATION

(75) Inventors: Frank Hwang, Sunnyvale, CA (US); Howard Yang, Shanghai (CN); Chuen-Der Lien, Los Altos Hills, CA (US); Jimmy Lee, Palo Alto, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/618,545

(22) Filed: Dec. 29, 2006

Related U.S. Application Data

(63) Continuation of application No. 10/993,657, filed on Nov. 19, 2004, now Pat. No. 7,176,738.

(60) Provisional application No. 60/523,820, filed on Nov. 20, 2003.

(51) Int. Cl.
 *G06F 1/04* (2006.01)
(52) U.S. Cl. .................. 327/291; 327/299; 327/162

(58) Field of Classification Search .................. 327/291, 327/293, 294, 299, 146, 147, 150, 159, 154–156, 327/162
See application file for complete search history.

(56) References Cited

U.S. PATENT DOCUMENTS

| | | | | |
|---|---|---|---|---|
| 5,021,754 A | * | 6/1991 | Shepherd et al. | 332/128 |
| 5,337,024 A | * | 8/1994 | Collins | 332/127 |
| 5,420,545 A | * | 5/1995 | Davis et al. | 331/17 |
| 5,737,694 A | * | 4/1998 | McMahill et al. | 455/76 |
| 5,815,694 A | * | 9/1998 | Ganfield et al. | 713/501 |
| 5,856,766 A | * | 1/1999 | Gillig et al. | 331/176 |
| 6,211,747 B1 | * | 4/2001 | Trichet et al. | 332/128 |
| 6,348,823 B1 | * | 2/2002 | Pan | 327/159 |
| 6,538,933 B2 | * | 3/2003 | Akioka et al. | 365/194 |
| 6,608,530 B1 | * | 8/2003 | Green et al. | 331/25 |
| 6,856,180 B1 | * | 2/2005 | Starr et al. | 327/147 |
| 7,003,049 B2 | * | 2/2006 | Hietala | 375/295 |
| 7,176,738 B1 | * | 2/2007 | Hwang et al. | 327/291 |
| 7,308,596 B1 | * | 12/2007 | Hwang et al. | 713/500 |

\* cited by examiner

*Primary Examiner*—Lincoln Donovan
*Assistant Examiner*—Hai L Nguyen
(74) *Attorney, Agent, or Firm*—Heimlich Law, PC; Alan Heimlich, Esq.

(57) ABSTRACT

A method and apparatus for clock generation have been disclosed having a selector logic block that controls operation based upon inputs such as analog input(s), digital input(s), a lookup table, and preset value(s), and combinations of such.

5 Claims, 13 Drawing Sheets

METHOD AND APPARATUS FOR CLOCK GENERATION

RELATED APPLICATION

This patent application claims priority of U.S. Provisional Application Ser. No. 60/523,820 filed Nov. 20, 2003 titled "Method and Apparatus for Clock Generation", which is hereby incorporated herein by reference. The present Application for Patent is a continuation of U.S. patent application Ser. No. 10/993,657 titled "Method and Apparatus for Clock Generation" filed Nov. 19, 2004, now issued as U.S. Pat. No. 7,176,738 B1 on Feb. 13, 2007, by the same inventors, and is hereby incorporated herein by reference.

FIELD OF THE INVENTION

The present invention pertains to clock generation. More particularly, the present invention relates to a method and apparatus for clock generation using Phase Lock Loops (PLLs).

BACKGROUND OF THE INVENTION

Clocks are an integral part of electronics. Their use is wide and diverse. Clocks are used for circuit control, to keep track of time, etc. Within the personal computer clocks are used by a variety of logic blocks including, but not limited to, for example, the central processor unit (CPU), as bus clocks, clocks for system chip sets, clocks for peripheral devices, such as but not limited to, disk drives, storage units, etc. Additionally they are used to synchronize events and provide a reliable source of a stable frequency.

For example, FIG. 3 illustrates an approach 300 showing clock generation and several system components. Here at clock chip 302 three clock signals 302-1 CPU clock, 302-2 PCK clock, and 302-3 SRC clock are generated and distributed to various components. CPU 304 receives CPU clock 302-1 and may communicate and/or generate clock signals via link 305 for use by the System Chip set 306. Additionally, the Clock chip 302 and system chip set 306 interface via link 307.

Often the speed of a system needs to be adjusted. Often this is accomplished by adjusting the clocks used by the system. For example, in FIG. 3 an External Trigger Event 308 may indicate that a change in system speed is needed. This may be communicated to the CPU 304 as an interrupt signal 309. In one implementation, the interrupt 309 causes the CPU 304 to be interrupted from its processing to effect a change in system speed. This may be accomplished, for example, by having the CPU 304 communicate via link 305 to the system chip set 306 then via 307 to effect a change in the clock chip 302 thereby affecting those clocks 302-1 through 302-3 possibly needing changing. The CPU 304 in one implementation will cause an I2C signal to be generated which will effect the changes needed in clock chip 302.

FIG. 4 illustrates one implementation 400 inside a clock chip showing two clocks being generated. At 402 is a reference clock which is communicated via link 403 to an M-divider block 404 whose output is communicated via 405 to Phase detector and Charge pump and VCO block 406. The output of the Phase detector and Charge pump and VCO block 406 is communicated via 407 to the CPU clock output divider 408 whose output 409 is communicated to a CPU. Block 406 output via 407 is also communicated to PCI clock output divider 410 whose output 411 is used by, for example, PCI circuits. Block 406 output via 407 also is communicated to N-divider 412 whose output 413 goes back into block 406. N-divider 412 is controlled by outputs communicated via 415 from a look up table (LUT) 414. LUT 414 is controlled by an input from an I2C control register 416 which is communicated to the lookup table via 417. M-divider 404 is controlled by outputs communicated via 419 from a look up table (LUT) 414. LUT 414 is controlled by an input from an I2C control register 416 which is communicated to the lookup table via 417. In this way the I2C can control the output frequency at, for example, 409 and 411.

In this implementation, the source of the I2C signals is created by the CPU, for example, 304 in FIG. 3. Thus the CPU which may be interrupted by an external trigger event 308 communicated by 309 to the CPU 304 will result in the CPU 304 generating the I2C signals which change system speed. In this implementation then, CPU resources are required to change the system speed and thus the CPU must process this request and therefore has fewer resources available for processing other task. This implementation then affects the available CPU resources by requiring it to generate signals required for changing system clocks.

FIG. 5 illustrates one implementation 500 inside a clock chip showing two clocks being generated. At 502 is a reference clock which is communicated via link 503 to an M-divider block 504 whose output is communicated via 505 to Phase detector and Charge pump and VCO block 506. The output of the Phase detector and Charge pump and VCO block 506 is communicated via 507 to the CPU clock output divider 508 whose output 509 is communicated to a CPU. Block 506 output via 507 is also communicated to PCI clock output divider 510 whose output 511 is used by, for example, PCI circuits. Block 506 output via 507 also is communicated to N-divider 512 whose output 513 goes back into block 406. N-divider 512 is controlled by outputs communicated via 519 from an I2C control register 516. M-divider 504 is controlled by outputs communicated via 521 from an I2C control register 520. In this way the I2C can control the output frequency at, for example, 509 and 511.

In this implementation, the source of the I2C signals is created by the CPU, for example, 304 in FIG. 3. Thus the CPU which may be interrupted by an external trigger event 308 communicated by 309 to the CPU 304 will result in the CPU 304 generating the I2C signals which change system speed. In this implementation then, CPU resources are required to change the system speed and thus the CPU must process this request and therefore has fewer resources available for processing other task. This implementation then affects the available CPU resources by requiring it to generate signals required for changing system clocks.

Thus, in one implementation when there is an external event that needs to change system clocks and/or speed (for example, CPU clock, PCI clock etc.), it has to interrupt the CPU from doing normal application programs. The CPU will stop its normal operation to send commands to the system chipset. The System chipset will then program the clock chip to change the speed by using the I2C bus. When the external event is finished, the CPU may be interrupted again to change back to the normal speed. This interrupting will slow down overall system performance. Additionally, sometimes the CPU may be executing a program which does not allowed for interruption. Additionally, the use of the I2C bus to effect this change may not be efficient. This presents a problem.

Additionally, clock chips may use three clock generators, for example, PLLs to generate three clocks. In a system this may force the sharing of clocks, for example the CPU and the SRC (serial reference clock used for PCI Express) may have to share the same clock frequency. In some applications the system may want to speed up, for example, the CPU without change the frequency of other circuits, like the SRC. This may not be possible in a three PLL clock generator where a common clock is shared. This presents a problem.

BRIEF DESCRIPTION OF THE DRAWINGS

The invention is illustrated by way of example and not limitation in the figures of the accompanying drawings in which.

DETAILED DESCRIPTION

This design, as exemplified in various embodiments of the invention, illustrates how various clock generation characteristics, such as but not limited to, frequency, slew rate, etc. may be changed without the need to interrupt a CPU's normal execution for effecting such changes. The change may be accomplished by changing, for example, a clock chip PLL N-divider directly.

By not having to interrupt a CPU to effect a speed change, the CPU throughput may be enhanced. By implementing speed changes directly, there may be less likelihood of a conflict between programs executing within the CPU, the associated overhead such as task switching, saving state, etc. Additionally, by implementing speed changes without the need for CPU intervention, speed and/or reliability may be enhanced.

Figure 6:
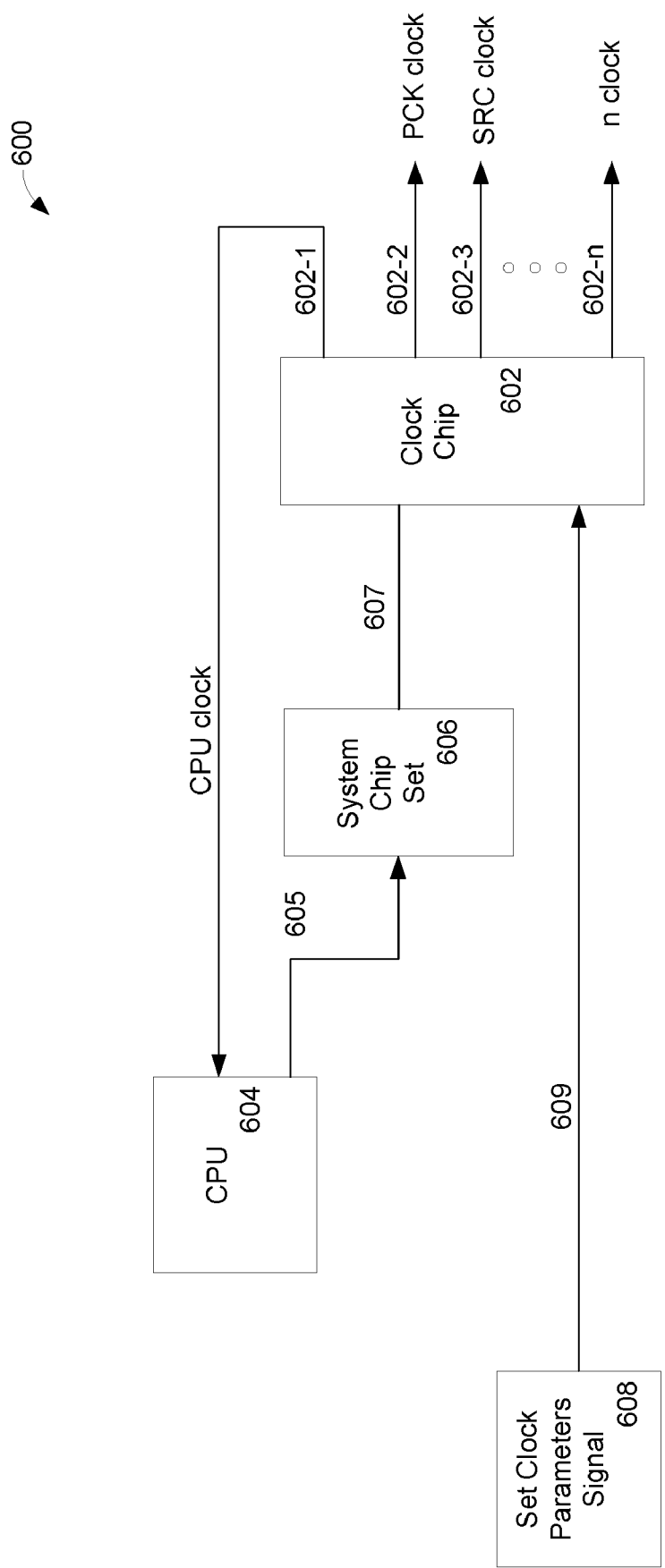
FIG. 6 illustrates one embodiment of the invention showing a top level overview of signals.

FIG. 6 illustrates one embodiment of the invention 600 showing a top level overview of signals. At clock chip 602 a variety of clock signals 602-1 CPU clock, 602-2 PCK clock, 602-3 SRC clock, and other clocks 602-$n$ (such as a PCI clock) are generated and distributed to various components. CPU 604 receives CPU clock 602-1 and may communicate and/or generate clock signals via link 605 for use by the System Chip set 606. Additionally, the Clock chip 602 and system chip set 606 interface via link 607.

The speed of the system may need to be adjusted. In one embodiment, this is may be accomplished by Set Clock Parameters Signal 608 indicating such a change is needed. This may be communicated to the Clock chip 602 via link 609. While FIG. 6 shows Set Clock Parameters Signal 608 as being singular, it is to be appreciated by one of skill in the art that in other embodiments of the invention a variety and plurality of Set Clock Parameters Signals may be communicated to clock chip 602 to adjust clock frequencies. Additionally, the communication of such signals to clock chip 602 is not necessarily static in nature. That is level sensitive, edge sensitive, as well as time varying signals may be communicated to clock chip 602 to effect changes in clock chip 602.

In one embodiment of the invention, as can be seen in FIG. 6, the set clock parameter signal 608 communicated to the clock chip 602 via signal and/or signals 609 is able to change parameters of the clock chip 602, for example, changing output clock frequency without interrupting the CPU or controller. Additionally, in another embodiment of the invention clock chip parameters such as at clock chip 602 may be set by signal 609 which does not consist of, for example, I2C commands.

In one embodiment of the invention the set clock parameter signal at 608 may originate from a variety of sources. For example, but not limited to, being generated independently, being generated by, for example CPU 604, and/or in combination with being generated from, for example, system chip set 606. Thus one of skill in the art will appreciate that the set clock parameter signal at 608 which results in signals 609 affecting the various clock parameters in clock chip 602 may originate from a variety of sources.

In one embodiment of the invention, signal 609 may come directly from, for example the CPU 604, a system control or system chip set 606, or from another source.

In one embodiment of the invention, changing the clock frequency may be accomplished by an analog and/or digital input signal to the clock chip, for example 602 in FIG. 6.

In one embodiment where the clock chip receives an analog signal affecting clock chip generation parameters, the clock chip may include an analog to digital (A/D) converter to receive the input analog signal or signals. In one embodiment of the invention the output signals from an analog to digital converter located on the clock chip 602 may be used to look up preset and/or various clock generation parameters, for example, frequency, slew rate, output drive, etc. These preset values in one embodiment may be preset at fabrication time, or alternatively loaded at some later time.

Such preset values may be used to select values "N" or "M" or output divider ratios in a PLL. In another embodiment of the invention, the preset values may be the actual values used for "N" or "M" or output divider ratios in one more PLLs on the clock chip.

In another embodiment of the invention, the input analog signal may indicate a relationship to another system parameter. For example, the input analog signal may indicate the temperature of a system, a CPU, a controller, or other chips such as a graphics chip. In this way, one of skill in the art will appreciate that clock generation parameters such as clock frequency may be related to other system parameters such as temperature. In one embodiment the temperature of the CPU may be communicated to the clock chip such that the clock chip may adjust its output frequency so as not to cause a CPU to overheat, or to run faster when needed.

The input signal or signals to the clock chip may be analog in nature and may be analog current signals and/or analog voltage signals. Additionally the output of an A/D on the clock chip need not be linear. For example, and A/D may have a nonlinear response to an input signal. In this way for example, the A/D may more closely track the nonlinear characteristics of other components in a system. For example, sensitivity to temperature is often exponential in nature rather than linear. In this way by sensing in an exponential fashion the parameter of a system, such as for example, temperature, an A/D for example within a clock chip such as 602 may be able to more effectively control output clock frequencies.

In another embodiment of the invention the input signal or signals may be used to select "N" or "M" or output divider ratios for a variety of PLLs located within a clock chip. In one embodiment the input signals may serve as inputs to a switch or multiplexer to select different values of "N" or "M" or output divider ratios. In another embodiment the value of "N" or "M" or output divider ratios changes may be done gradually from one value to another. A gradual change in "N", or "M", or output divider ratios or a combination of these, may provide for a smoother transition from one frequency to another. Another embodiment, the rate of the change from one value to another value, such as from a first frequency to a second frequency may be controlled by a preset value, in for example, a register. In another embodiment the rate of change of a parameter may be determined by control signals. One such example would be where, for example, a higher voltage may signal that output clocks need to drive to a higher voltage level and/or at a faster slew rate. Another example is where a simple comparator located on the clock chip may determine based upon an input signal, the slew rate for driving the output clock signal for a particular clock. Additionally, the direction of the value change may be determined by the inputs to the clock chip, outputs of logic located on the clock chip, or a combination of these. For example a clock output may change to a higher frequency and then change back to a lower frequency based upon, for example, temperatures signals received by the clock chip. The preset stored values may further be used to enable and/or disable a function through the value stored. For example a preset value of 0 may indicate that the clock chip is not to respond to, for example, an input temperature signal. Additionally other input signals may control other functions such as enabling and/or disabling clock frequency changes. For example, a system determine that it is the process of shutting down and that operating the CPU at a higher frequency is necessary to save data and thus has priority over a CPU temperature signal.

Slew rate of the clock chip output or outputs may be controlled, for example, by having various output devices operating in parallel and selectively turning on different output devices. For example if the system is operating at a slow frequency it may be sufficient for the clock generator to drive the output clock signal with fewer transistor devices than if the clock chip is operating at a higher frequency where the slew rate needs to be increased and so more transistors are operating in parallel to drive the signal. One of skill in the art will appreciate that by dynamically controlling output drive, skew, slew rates, lower power, better performance, reduced Electro-Magnetic Interference (EMI), etc. may be achieved. To reduce EMI using slew rates, slew rate may be set by register values which may be programmed before and/or after the chip has been put in a system. In the latter case, for example, the programming of register values may be done during power up and/or when the system is running.

The clock chip may consist of a variety of phase locked loops each PLL may be independently controlled. For example, in a clock chip having more than three PLLs it may not be necessary for sharing of clock signals which may not be optimum for each part of a system. By having independent control for each PLL a clock chip may generate independent clock frequencies for the CPU, for a PCI (Peripheral Component Interconnect) bus, for a SRC (Serial Reference Clock), for USB (Universal Serial Bus) interfaces, etc.

One of skill in the art will appreciate that having four (or more) independent controllable clock generators may allow for matching clocks to the maximum performance of various system components thus resulting in increased performance, reliability, etc. Additionally, such features as independent spread spectrum control (SSC) for each clock generator may result in reducing overall system EMI.

While the signals communicated to clock chip 602 in FIG. 6 illustrate changing clock frequency, it is to be understood by one of skill in the art that other parameters related to the clock chip may also be affected. For example, slew rate, jitter, drive capability, and other parameters associated with the clock may be adjusted. For example, when driving a system at high-speed, it may be advantageous to carefully match output impedance with what is being driven, slew rate may need to be adjusted, and frequency may need to be dithered to reduce EMI. At lower operating frequencies these parameters may be different as the system may be less sensitive to slower clock operation.

Figure 7:
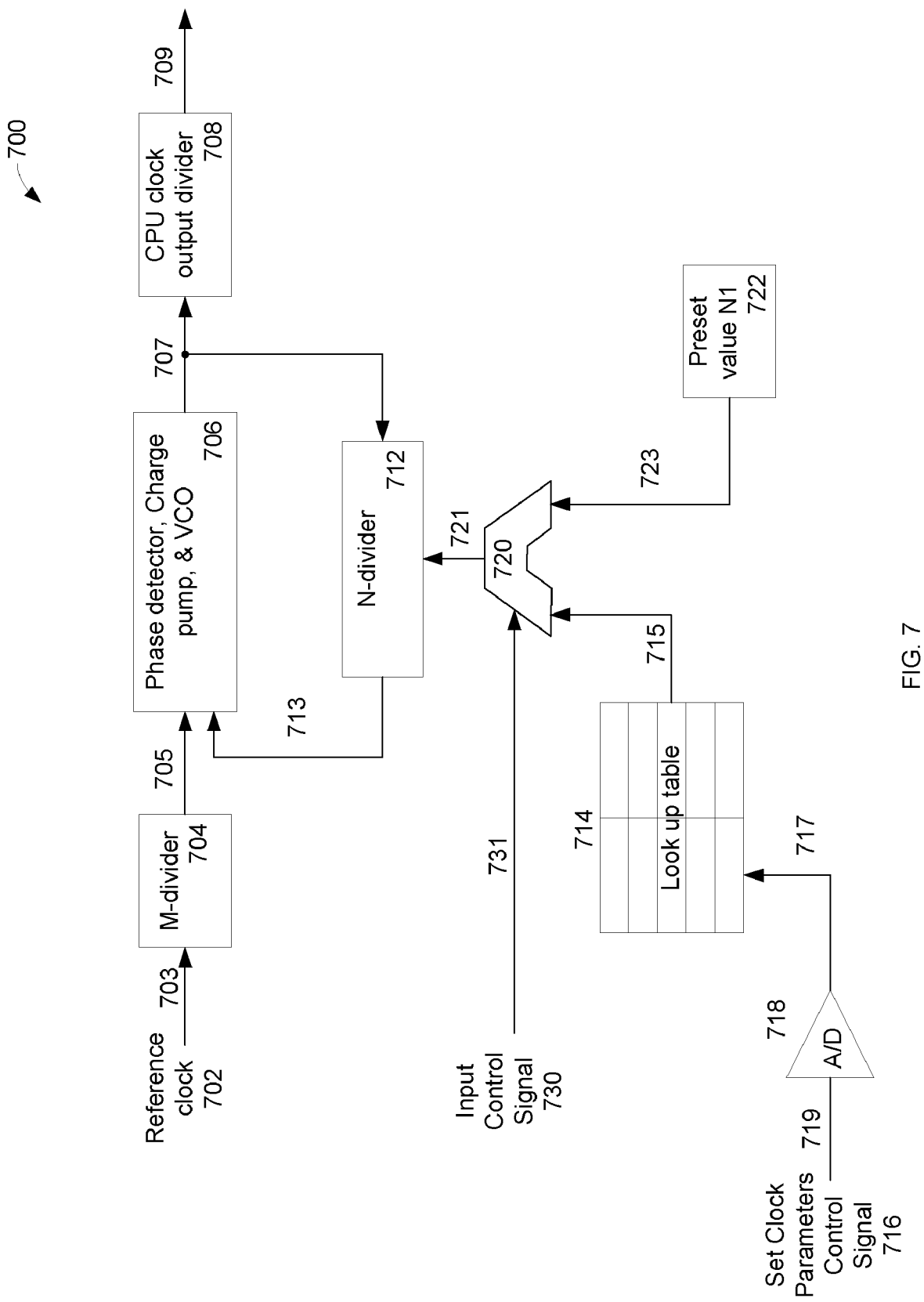
FIG. 7, FIG. 8, and FIG. 9 illustrate various embodiments of the invention showing details of a clock chip implementation.

FIG. 7 illustrates one embodiment of the invention 700 inside a clock chip showing a single clock being generated from a single PLL. At 702 is a reference clock which is communicated via link 703 to an M-divider block 704 whose output is communicated via 705 to Phase detector and Charge pump and VCO block 706. The output of the Phase detector and Charge pump and VCO block 706 is communicated via 707 to the CPU clock output divider 708 whose output 709 is communicated to a CPU. Block 706 output via 707 also is communicated to N-divider 712 whose output 713 goes back into block 706. N-divider 712 is controlled by outputs communicated via 721 from a switch or multiplexer 720 whose inputs are 715 from a look up table (LUT) 714 or 722 from a Preset Value N1 722. LUT 714 may be controlled by an input from a set clock parameters control signal 716 which is communicated to an A/D 718 via 719 and the output of the A/D 718 is communicated to the lookup table via 717. In this way, for example, an analog input can control the output frequency at, for example, 709. Additionally, Preset value N1 722 is selectable via the multiplexer 720. Multiplexer 720 is controlled by a signal 731 from, for example, an input control signal 730.

What is to be appreciated is that in this embodiment of the invention, an analog signal may be used as well as a preset value N1 722. The look up table value 714 or the preset value 722 may be selected by the multiplexer 720 in response to an input control signal 730. It is to be understood that 730 represents a source of a signal which is communicated via 731 to the multiplexer 720 to select, in this embodiment, one of two sources of a signal 721 which controls N-divider 712. In other embodiments one of skill in the art will appreciate that the multiplexer 720 may select from more than two sources and that the signals controlling the multiplexer, represented by 731 may be one or more signals. Additionally, the signals controlling the multiplexer need not be static nature, that is they may dynamically change and the signal communicated to the multiplexer need not be a level sensitive signal.

As illustrated in FIG. 7 an analog input signal at A/D 718 may control frequency. What is to be appreciated is that the analog signal may come from a variety of sources. For example a simple resistor divider network may supply the analog signal. Additionally, the clock generator chip may supply a reference voltage and/or current that may allow the analog signal to be set by one or more resistive elements connected to one or more pins on the clock generator. One of skill in the art will appreciate that if the resistive network has a temperature sensitive component (such as a thermistor) that the analog signal will vary with temperature and thus may affect the output frequency of the clock generator.

Figure 8:
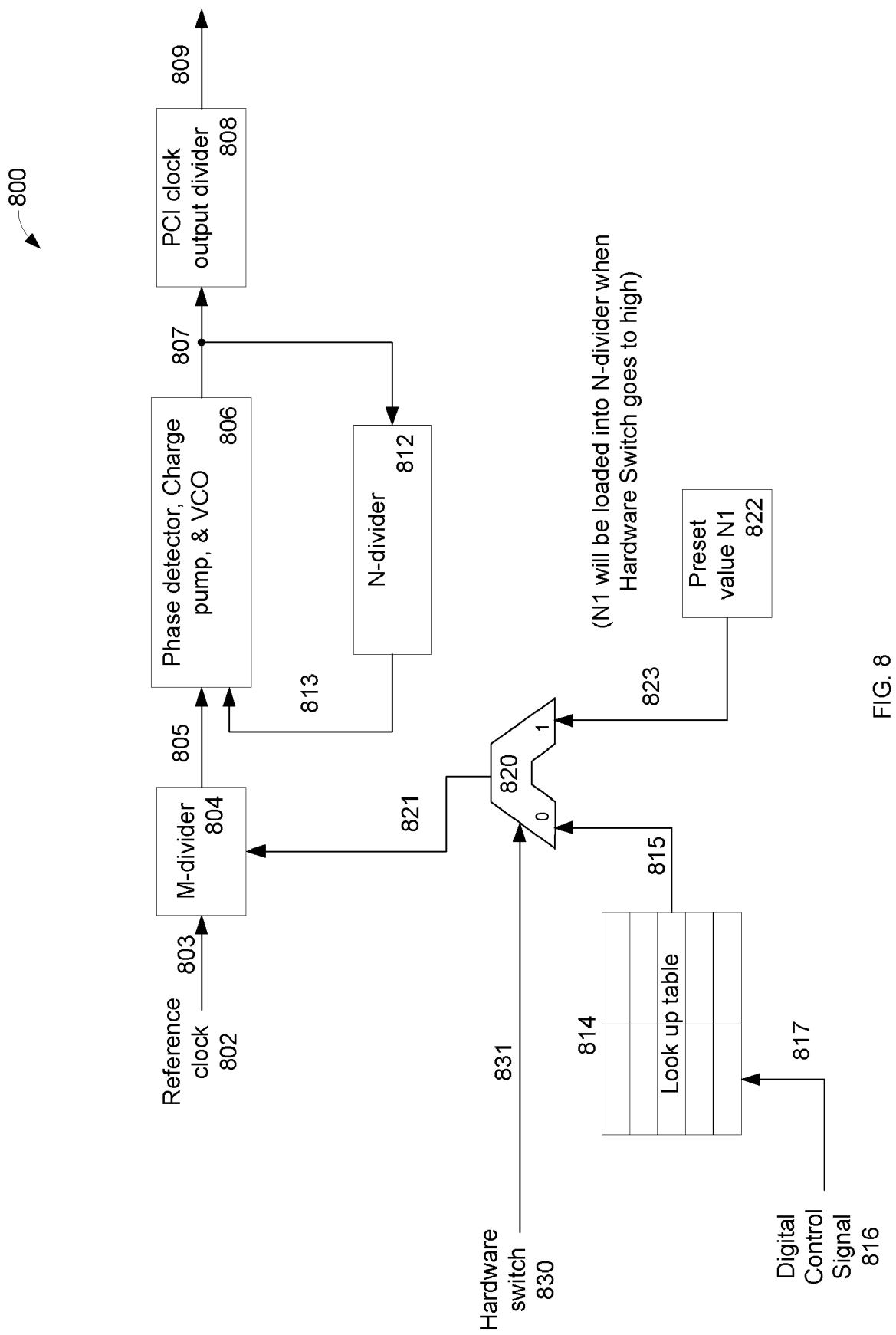

FIG. 8 illustrates one embodiment of the invention 800 inside a clock chip showing one PCI clock being generated. At 802 is a reference clock which is communicated via link 803 to an M-divider block 804 whose output is communicated via 805 to Phase detector and Charge pump and VCO block 806. The output of the Phase detector and Charge pump and VCO block 806 is communicated via 807 to the PCI clock output divider 808 whose output 809 is communicated to, for example, PCI circuits. Block 806 output via 807 also is communicated to N-divider 812 whose output 813 goes back into block 806. M-divider 804 is controlled by outputs communicated via 821 from a switch or multiplexer 820 whose inputs are 815 from a look up table (LUT) 814 or 823 from a Preset Value N1 822. LUT 814 may be controlled by an input from a Digital Control Signal 816 which is communicated to the lookup table via 817. In this way the Digital Control Signal can control the output frequency at 809. Additionally, Preset value N1 822 is selectable via the multiplexer 820. Multiplexer 820 is controlled by a signal 831 from, for example, a hardware switch 830. In this embodiment, preset value N1 822 is loaded into the N-divider once the signal from the hardware switch 830 goes active (high in this example).

Figure 9:
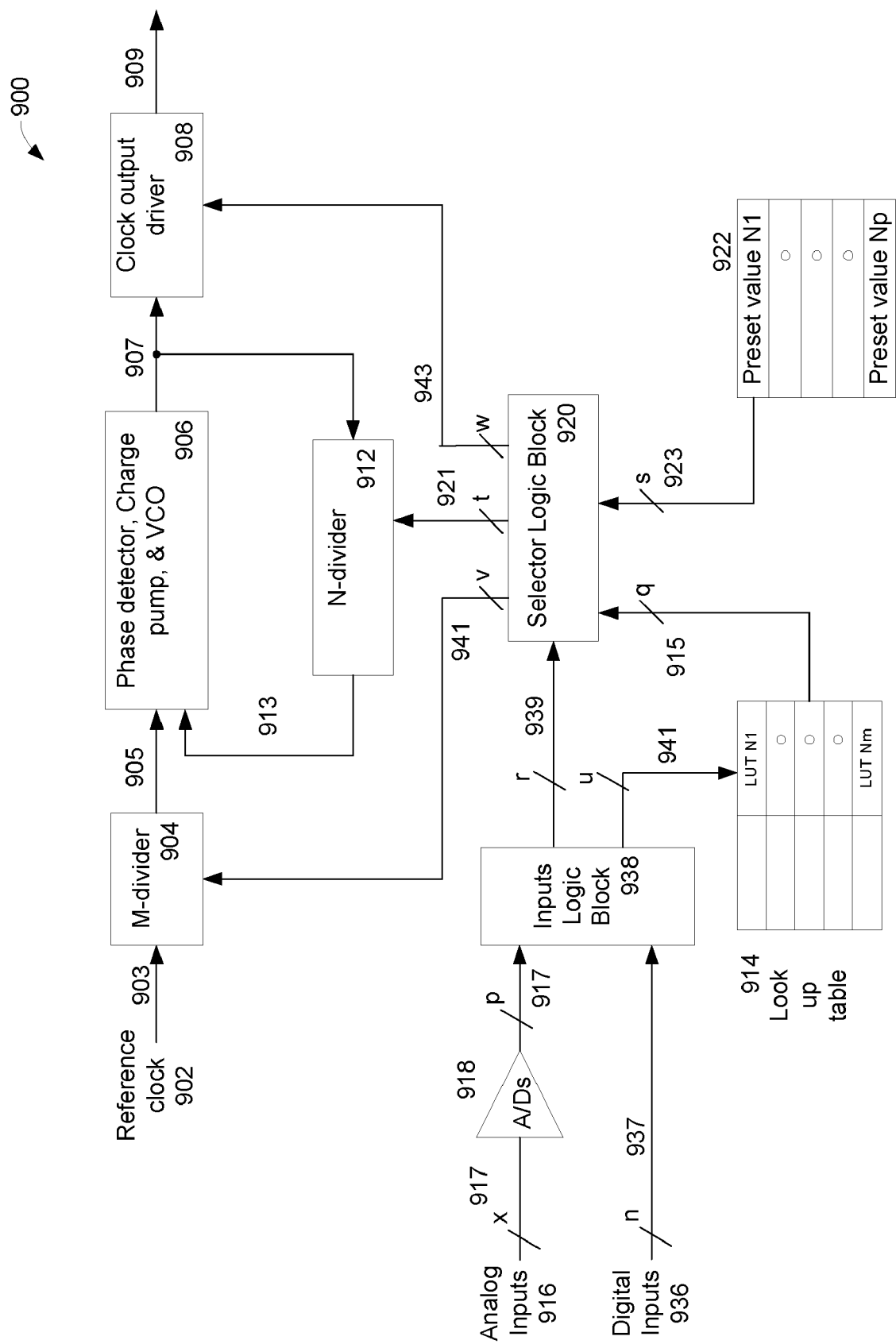

FIG. 9 illustrates one embodiment of the invention 900 inside a clock chip showing a clock being generated. At 902 is a reference clock which is communicated via link 903 to an M-divider block 904 whose output is communicated via 905 to Phase detector and Charge pump and VCO block 906. The output of the Phase detector and Charge pump and VCO block 906 is communicated via 907 to the clock output divider 908 whose output 909 is communicated to a circuit. Block 906 output via 907 also is communicated to N-divider 912 whose output 913 goes back into block 906. N-divider 912 is controlled by outputs (t) communicated via 921 from selector logic block 920 whose inputs (q) are 915 from a look up table (LUT) 914 or (s) 923 from a Preset Value N1 through Np 922. LUT 914 may be controlled by outputs (u) from an inputs logic block 938 which is communicated to the lookup table via 941. In this way the inputs logic block 938 may affect parameters of the clock, for example, the output frequency at 909 via control signals (t) at 921 into the N-divider 912, and signals (v) at 941 into the M-divider 904. Additionally, outputs (u) from the inputs logic block 938 may affect the clock output driver 908 via signals (w) at 943. These clock output driver control signals (w) at 943 may control such things as, but not limited to, for example, output drive level, output impedance, slew rate, jitter, etc. Additionally, Preset value N1 through preset value Np 922 is selectable via the selector logic block 920. The selector logic block takes as inputs the LUT entries (q) at 915, the preset values (s) at 923, the digital inputs (n) from 936 communicated via 937, and the outputs (p) at 917 from one or more analog to digital converters 918 converting one or more analog inputs (x) at 916 input via 917 to the one or more A/Ds 918.

What is to be appreciated, in this embodiment is that selector logic block 920 may select to use lookup table entries 914 or various preset values 922 based, for example, on a variety of digital inputs 936 received via 937, analog inputs 916 via 917 converted at 918 and communicated via 919 to inputs logic block 938 where any possible combination (static and/or dynamic) of signals may be combined to produce outputs (r) 939 as an input the selector logic block 920. One of skill on the art will appreciate that this provides much flexibility in clock generation. For example various parts of a system may operate at various clock frequencies and thus generate varying amounts of heat. For optimum performance it may be necessary to slow down a system that is generating too much heat. However, slowing down an entire system because only one section is overheating may be a waste of resources. In the embodiment illustrated in FIG. 9, it would be possible for the signals 916, for example, to include such parameters as temperature measurements at various points in the system. Based on this information the selector logic block may control the N-divider 912, M-divider 904, as well as the output drive via signal (w) at 943 to generate appropriate clock signals. In this way only the systems needing to slow down may be affected.

As illustrated in FIG. 9 analog inputs 916 and digital inputs 936 allow for greater flexibility in controlling a clock generator. A combination of analog inputs and digital inputs may be used to select a mode of clock generation. For example, analog input may consist of the CPU temperature, and other signals, for example, the speed of a fan which is being used to cool the CPU. Analog and/or digital inputs may be used to also control and/or override a combination of analog and/or digital inputs. For example, in a system which may be overheating an analog input without CPU intervention or under any program control may slow the clock down so the system does not overheat. Additionally the system, a priori aware of the dynamics of, for example, CPU overheating, may decide that if the fan speed which is cooling the CPU suddenly drops to zero or close to zero, the clock should slow down rapidly. This function may be programmed via the digital inputs. In response if the fan speed is sensed on the analog templates to be approaching zero, the inputs logic block 938 in combination with lookup table 914 and/or preset value table 922 may select through the selector logic block 920 a proper M-divider 904 value, the proper N-divider 912 value, and the proper clock output driver 908 characteristics (via signal 943 (w)). In this way the thermal constant delay associated with the CPU overheating can be compensated for by quickly determining there is no additional cooling because the fan speed has dropped to near or at 0. Because of thermal resistance there is a time delay (thermal constant) in sensing temperature. Thus it is possible for a CPU to overheat before its temperature can be sensed. In this scenario then, if the cooling mechanism, such as a fan suddenly ceases to operate it may be possible to more quickly react to the possibility of overheating than to wait for a temperature sensor to indicate overheating. Thus in FIG. 9 by using a combination of analog inputs sensing such things as temperature fan speed etc. and under program control through digital inputs 936 it is possible for the system to configure itself so that if the fan speed drops to zero or near zero, the clock generator will respond appropriately in advance of an analog input indicating that temperature has risen above an acceptable value.

By utilizing a lookup table, which can be loaded under program control, presets, and the combination of analog and digital inputs it is possible to create a non-linear, dynamically adjustable clock system. Thus, such features as adjustable or fixed hysteresis is possible based on a variety of inputs. For example, to reduce EMI the clock generator may implement spread spectrum (SCC). This same clock however, may not want to change basic frequency until there is a 2 degree difference between the last temperature and the new temperature. This temperature hysteresis may be accomplished by sensing the temperature and using it as an input to the lookup table which does not change value until there is a 2 degree difference. Additionally the clock generator may not want to change the frequency until the to degree difference for example has lasted for 10 seconds this time delay or time hysteresis may also be built into the system through program control i.e. the digital inputs or may be implemented in the selector logic block for example.

In another embodiment of the invention, there may be four or more independent clocks being generated. This may be achieved by, for example, replicating the embodiment as illustrated in FIG. 9 four or more times on a chip. In another embodiment, common resources may be shared, for example, in a four PLL clock generator there may be a single reference clock (such as 902) but four of everything else.

In another embodiment, using FIG. 9 as an example, common inputs may be reference clock 902, analog inputs 916, and digital inputs 936, with selector block 920 directing different values for v, t, and w to the four or more separate PLL sections. What is to be appreciated is that different analog input 916 (x) and digital inputs 936 (n) may be directed to and/or control one or more PLLs in combination or independently. For example, in a four PLL clock generation system one of the clocks may be going to the CPU, another may be going to a memory controller, another one going to a serial ATA interface, and another going to a USB interface circuitry. Assume for the sake of illustration, that one of the analog inputs 916 consists of the RPM (revolutions per minute) information from the CPU cooling fan. In the case where the CPU begins to overheat, the system designer may desire for the CPU clock speed to decrease and because of this decrease would also like the memory controller to slowdown so that both the CPU and memory are in sync. However, the designer realizing that the serial ATA interface may be needed to store information as the CPU may shut down due to a temperature increase would like to have the ATA interface continue to operate at full speed. Thus as illustrated in FIG. 9 and as previously discussed, the single analog input related to the CPU cooling fan may affect both the CPU clock frequency as well as the memory controller clock frequency however leaving the serial reference clock for the serial ATA running at full speed. Continuing the example, at some temperature or fan speed the system designer may want to shut down all clocks so based on another temperature and/or RPM threshold the CPU clock, the memory clock, as well as the serial ATA clock may now be controlled. What is to be appreciated is that on an integrated clock chip having four or more independent PLL clock generators the analog inputs 916 and digital inputs 936 may be used in any combination to affect one or more of the clock generators.

The programming of the PLLs, for example via "N" or "M" or output divider ratios, the presets, etc. may be done in advance of the clock generator chip being placed in a system or once the chip is in a system. The programming in advance may be at fabrication time or some later time prior to operation in a circuit. For example, it may be programmed at wafer fabrication, after the chip is packaged, or after it is placed in a system before it is required to operate. The programming in advance of the chip operation is non-volatile. Once in a system, the LUT may be loaded under program control as may presets. These may be set up a power up, during a reset, or dynamically changed during system operation. A combination of default presets and values as well as loadable may be used. For the loadable values, volatile and/or non-volatile storage may be used.

Much like the programming of the "N" or "M" or output divider ratios or the presets, other parameters of the clock generator may be set, for example, skew, slew rate, etc. The A/D may also be preprogrammed or programmed later for certain characteristics. The preprogramming may be done through non-volatile memories and/or loaded by the system either during power-up or when the system is running. For example, by default the A/D may power-up to be linear in operation. Under program control this may be changed to non-linear because the system is aware that the temperature sensor attached to this particular A/D is non-linear. Thus, by programming the A/D characteristics, operation of the system may be enhanced.

Having four or more substantially independent clock generators may benefit system performance. For example, if in a computer system the CPU can run at 100-125 MHz (a 25%) margin, a PCI Express at 100-110 MHz (a 10% margin), and a SATA at only 100-100.1 MHz (a 0.1% margin), then if the CPU, PCI Express, and SATA share one PLL then the CPU, PCI Express and SATA performance will be limited to 100 MHz at a 0.1% margin. System performance will be limited by the tightest margin subsystem. On the other hand, if one PLL is dedicated for the CPU, one dedicated for the PCI Express, and another one for SATA, then the CPU can operate 25% faster, the PCI can have 10% more performance, and the 0.1% margin for the SATA can be satisfied. What is be appreciated is that by dedicating a PLL for each subsystem it may be possible to achieve increased system performance.

Figure 10:
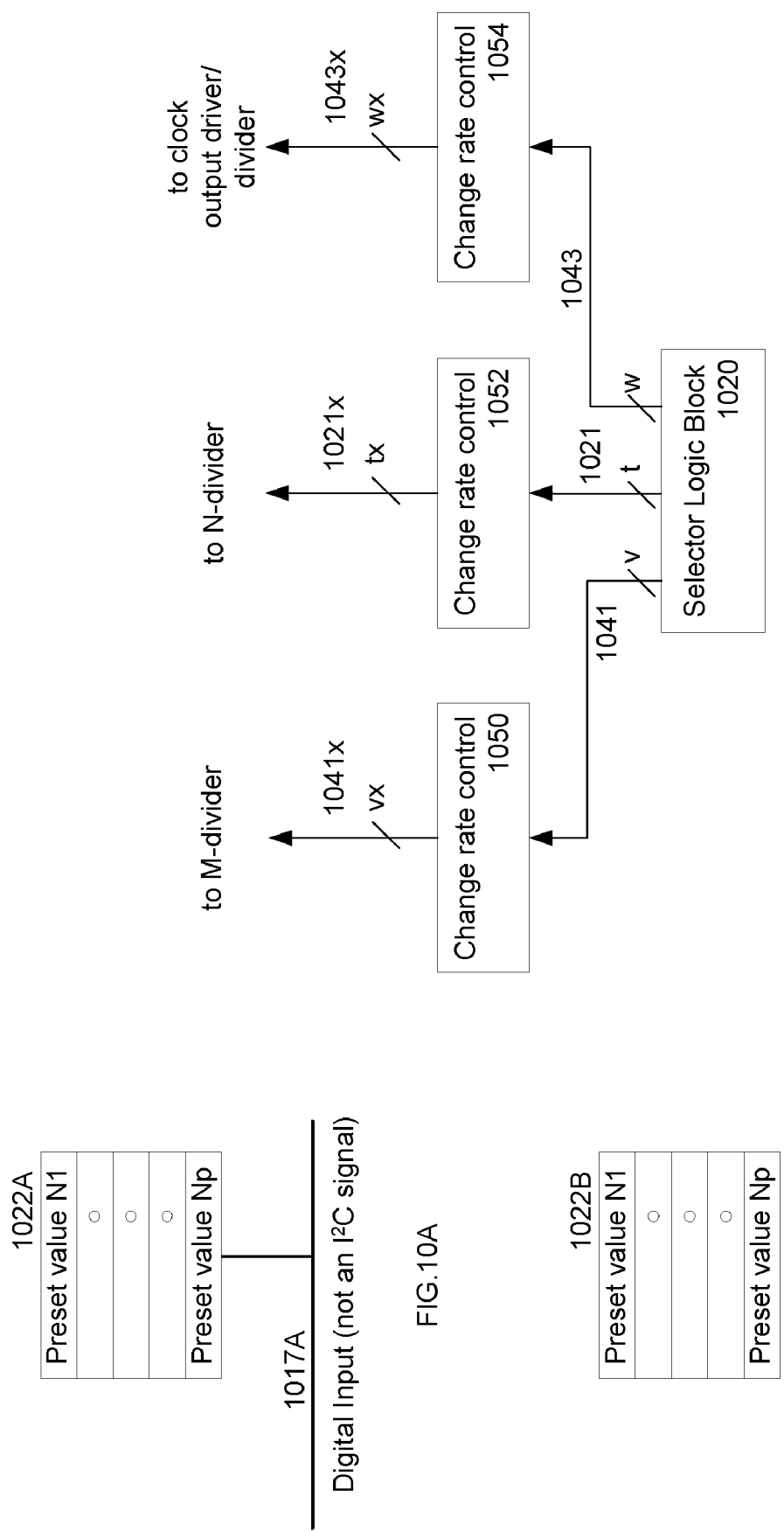
FIG. 10A, FIG. 10B, and FIG. 10C illustrate other embodiments of the invention.

FIG. 10A and FIG. 10B illustrate other embodiments of the invention. Preset values N1 through Np at 1022A in FIG. 10A in one embodiment are programmed via 1017A which may be connected to a digital input which is not an I2C bus or signal. The preset values in 1022A may be stored in, but are not limited to, such circuit devices as RAM, EPROM, flash, etc. That is, the preset values in 1022A may be stored in such a fashion as to be either volatile or nonvolatile.

In FIG. 10B preset values N1 through Np at 1022B are fixed in on the chip (such as on silicon). The values may be set at chip fabrication or after fabrication in a one time programming manner. That is the preset values N1 through Np may be stored via such devices as a ROM, EPROM, fuse programmable, laser cuts, implants, etc.

FIG. 10C is one embodiment of the invention illustrating change rate control. Selector logic block 1020 provides outputs 1041 (v), 1021 (t), and 1043 (w). These enter respectively change rate control blocks 1050, 1052, and 1054. The output from change rate control block 1050 is 1041x(vx) which may go to, for example, an M-divider. The output of change rate control block 1052 1021x (tx) may go to an N-divider. Output from change rate control block 1054 1043x (wx) may be routed to a clock output driver and/or divider. As illustrated in FIG. 10C, change rate control blocks 1050, 1052, and 1054 may independently control the rate of change of the M-divider, N-divider and the clock output driver and/or divider. In this way a pseudo-linear, and/or stepping changes may be made to M, N, and the clock output to control, for example, the output frequency. Additionally, by employing fine adjustments jitter may be affected on a cycle to cycle basis for a specified range. For example, the change with which the output frequency may be effectively made without affecting system operation may be limited. Taking this into account, change rate controls 1050, 1052, and 1054 may adjust respectably their outputs in such a manner as to not exceed a specified rate of change. In yet another embodiment, the change rate control blocks 1050, 1052, and 1054 may be interconnected so that each is aware of the rate of change of the other. Having the ability to change the rate control allows on a cycle by cycle basis the ability to control output parameters such as cycle to cycle jitter. Additionally change rate control need not be static in nature. For example, for spread spectrum control (SSC) the change rate control may effectively ramp up and ramp down the divider ratios so as to provide the sweeping operation needed to implement SSC.

Additionally, it is to be noted that the number of signal lines entering a change rate control block need not necessarily be the same number as lines exiting. For example, selector logic block 1020 has the group of v lines denoted as 1041 entering change rate control block 1050. Some of these lines may indicate not only an M-divider value but also the rate of change which change rate control block 1050 is to implement. The output signal lines vx as indicated by 1041x may be equal to, less than, or greater than the number of signal lines (v) entering the change rate control block 1050.

One of skill in the art will appreciate that the actual detailed mechanisms for control within a change rate control block may be implemented in hardware, software, or a combination of these. For example, a finite state machine (FSM) may be used as a simple up/down counter arrangement that may effectively alter the values issued to, for example, the M-divider to implement, for example, SSC. A simple LUT may also be implemented as well as a variety of other approaches. These details are not germane to the understanding of the invention. What is to be appreciated is that the change rate control allows for almost linear control of the output as well as the capability to rapidly change (step) the output characteristics (such as frequency).

Figure 11:
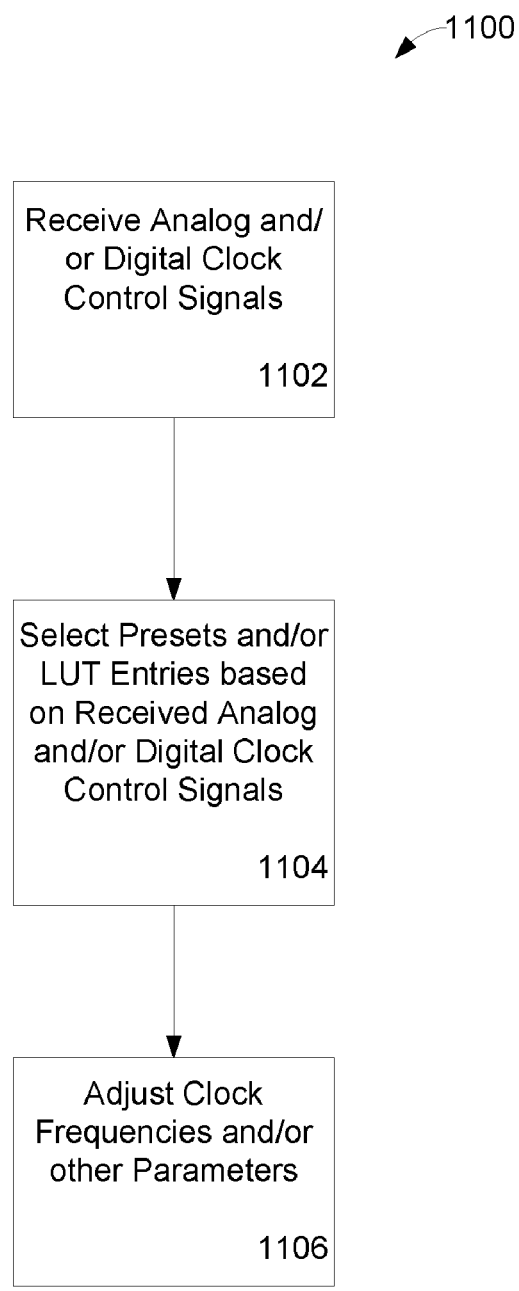
FIG. 11 illustrates one embodiment of the invention in flow chart form.

FIG. 11 illustrates one embodiment of the invention 1100 in flow chart form. At 1102 clock control signals are received, at 1104 presets and/or look up table entries are selected based on the received analog and/or digital clock control signals. At 1106 clock frequencies and/or other parameters are adjusted based upon the selected presets and/or look up table entries from 1104.

Figure 12:
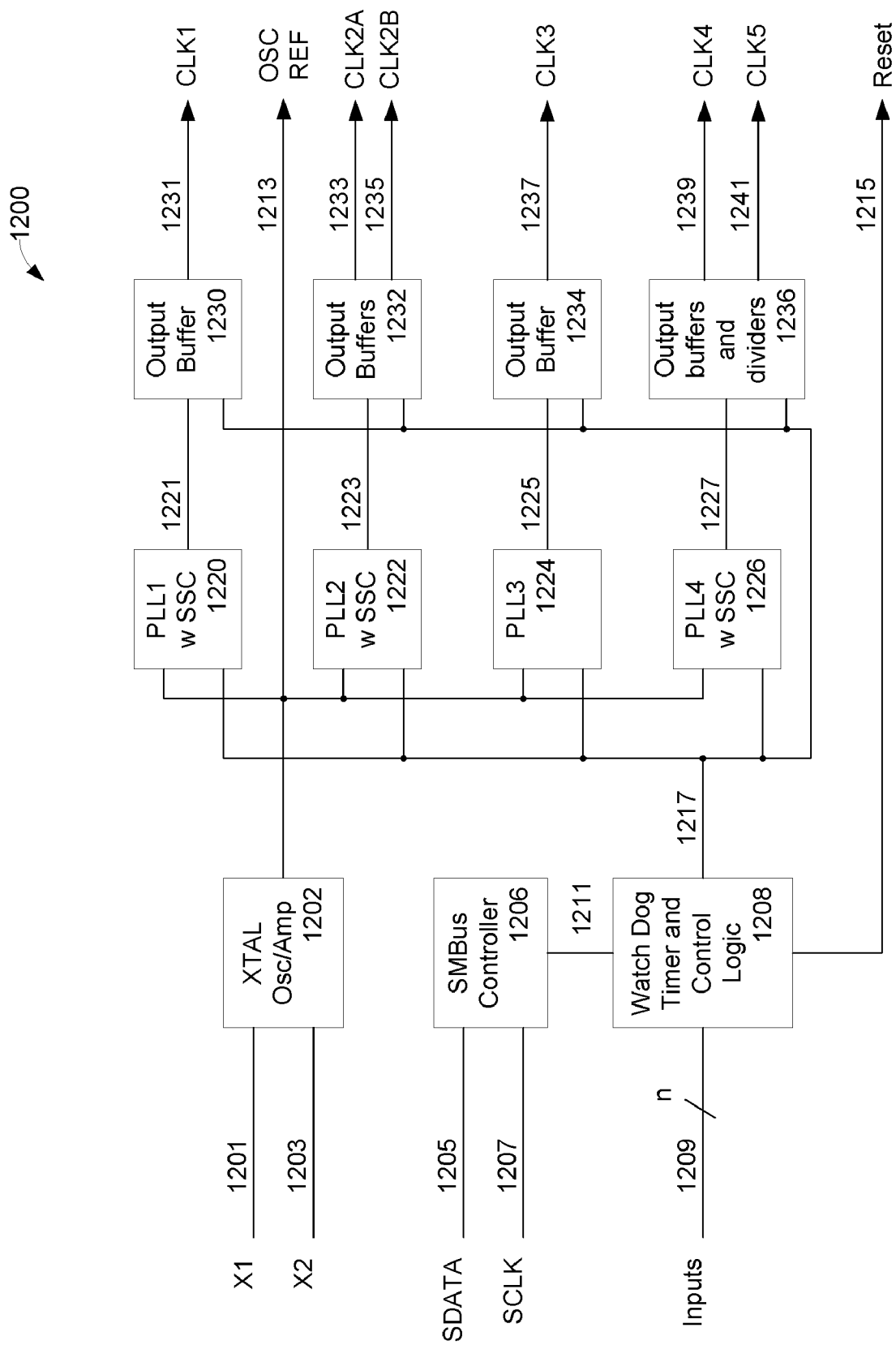
FIG. 12 illustrates one embodiment of the invention using four PLLs.

FIG. 12 illustrates one embodiment of the invention 1200 using four PLLs. Inputs consist of, in this embodiment, X1 1201 and X2 1203 that go to a crystal oscillator amp 1202 whose output 1213 serves as an oscillator reference and is also distributed to PLL1 1220, PLL2 1222, PLL3 1224, and PLL4 1226. SM bus controller 1206 receives as imports SDATA 1205 and SCLK 1207. The output of the SM controller 1206 is communicated via 1211 to watch dog timer and control logic circuit 1208 which receives inputs 1209 (n). One output of the watchdog timer and control logic 1208 is 1215 a reset which may be based on, for example, watchdog timer values which have been programmed into the clock circuit via inputs 1209 and/or via the SM bus controller 1206. Another output of the watchdog timer and control logic 1208, primarily control logic 1217 is distributed to PLL1 1220, PLL2 1222, PLL3 1224, PLL4 1226, output buffer 1230, output buffers 1232, output buffer 1234, and output buffers and dividers 1236. In this way inputs 1209 or inputs received from the SM bus controller may affect operation and control parameters of any of the PLLs 1 through 4, or the output stages, buffers, or dividers. The output from PLL1 is communicated via 1221 to output buffer 1230 which is then communicated via 1231 as CLK1. PLL2 1222 output is communicated via 1223 to output buffers 1232 which then drives two clocks; CLK2A 1233 and CLK2B 1235. PLL3 1224 output is communicated via 1225 to output buffer 1234 which is then communicated as CLK3 1237. PLL 4 1226 output is communicated by 1227 to output buffers and dividers circuitry as indicated at 1236. Outputs from 1236 are CLK4 1239 and CLK5 1241. In this embodiment, PLL1 1220 is indicated as having spread spectrum Control (SSC) capability as does PLL2 and PLL4. This SCC capability may be programmed by Inputs 1209 and/or via the SMBus Controller 1206. PLL3 1224 in this embodiment does not have SSC capability. Output buffer 1230 as indicated in this embodiment drives a single clock line, whereas 1234 output buffers drives two clock lines which may be of the same strength and/or of differing strengths, slew rates, output levels, etc. depending upon system requirements. Output buffers and drivers 1236 drives two signals 1239 and 1241. These clocks (1239 and 1241) may be of different strengths and may also be of different frequencies. For example, PLL4 may generate a 48 MHz clock signal which is communicated by 1227 to output buffer and drivers dividers 1236 which may then drive a 48 MHz signal on CLK4 1239 and then divide the 48 MHz signal received by 2, for example by flip-flop, and then buffer and output this 24 MHz signal as CLK5 1241.

What is to be appreciated is that in this embodiment (1200) parameters of all phase locked loops and all output stages (buffers, dividers, etc.) may be controlled by various inputs 1209 (n) and/or SM bus inputs (SDATA 1205). One of skill in the art will appreciate that more than four PLLs may be used in a clock generator and may be tailored to best suit a particular set of system requirements.

Figure 13:
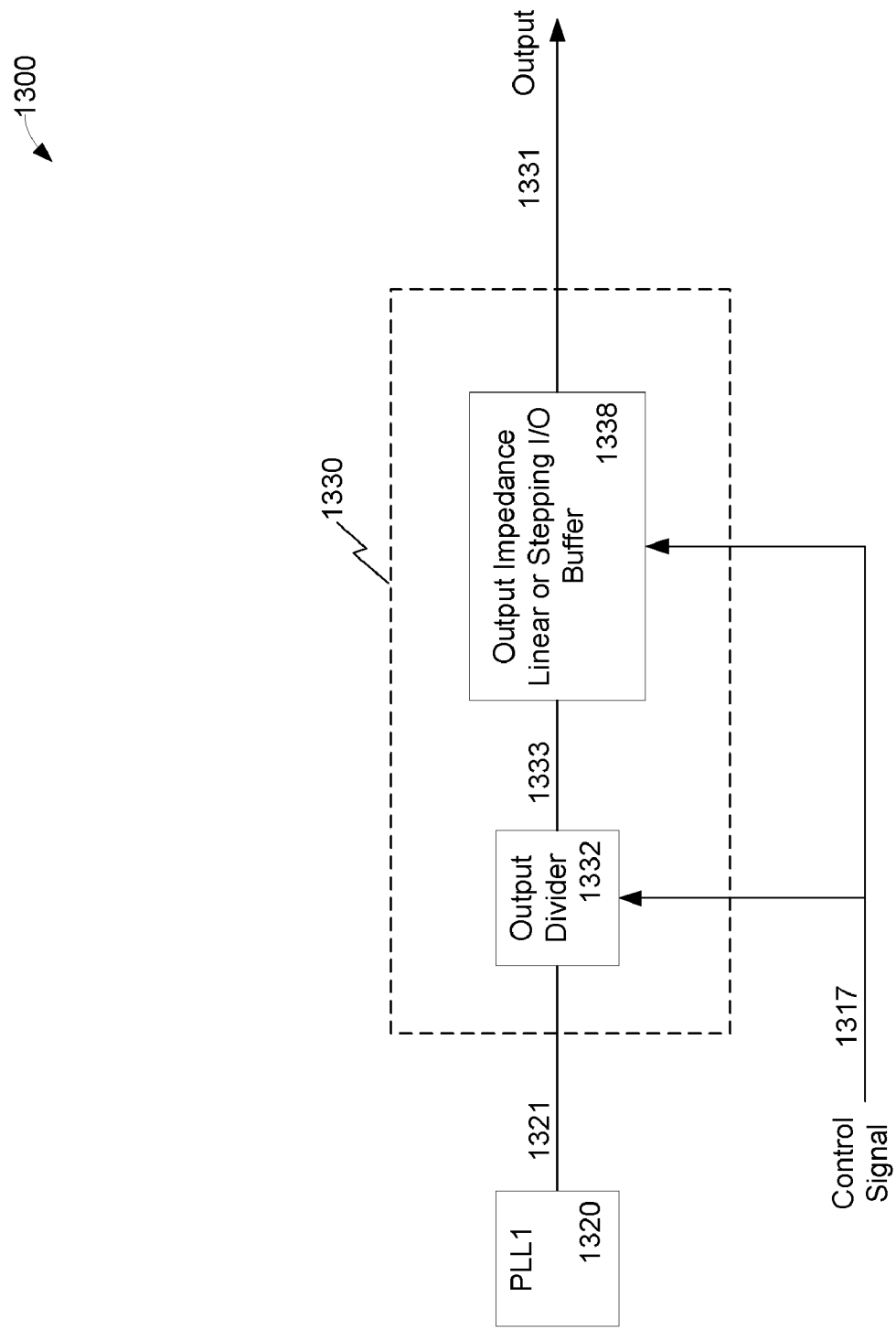
FIG. 13 illustrates more detail of an output stage.

FIG. 13 illustrates one embodiment 1300 of the invention showing more detail with the output driver stages 1330. PLL 1320 has an output which is communicated via 1321 to block 1330 output driver stages. Block 1330, in this embodiment has an output divider 1332 (which is optional). The output 1333 of output divider 1332 is communicated to logic block 1338 output impedance linear/stepping I/O buffer. The output 1331 from the output impedance linear/stepping I/O buffer 1338 is then communicated as an output to another part of the system. Also coming into output logic block 1330 is control signal 1317 which may go to output devices 1332 if present, as well as output impedance linear/stepping I/O buffer 1338. Control signal 1317 may determine parameters of, for example, output divider 1332. That is, by controlling the output divider 1332 the output 1321 of the PLL 1320 may be divided to provide a different frequency at 1333. Additionally, control signal 1317 goes to logic block output impedance linear/stepping I/O buffer 1338 for control. For example, control signal 1317 via controlling output impedance linear/stepping I/O buffer 1338 may control such things as overshoot on the output 1331. Other parameters which may be controlled are wave form reflection due to signals returning from a driven output 1331 back toward the output impedance linear/stepping I/O buffer 1338. Using such controls it may be possible to reduce the overshoot, undershoot, and/or the reflection waveform strength on the output 1331. The output impedance control may be via voltage and/or current control. For example controlling the amount of current which is allowed to flow to the output effectively controls the impedance of the output stage. Additionally, controlling the voltage with which the output is driven may affect the impedance via the saturation of the output stages. There are a variety of ways in which the output impedance may be controlled through discrete steps so that it appears to be somewhat linear. For example, paralleling and/or stacking output drive devices and selectively controlling their drive, drive levels, and timing will allow for impedance matching, and/or reflection control. What is to be appreciated is the output stage 1330 may consist of an output divider, output impedance linear/stepping I/O buffer, or in other embodiments other output control circuitry.

Thus a method and apparatus for clock generation have been described.

Figure 1:
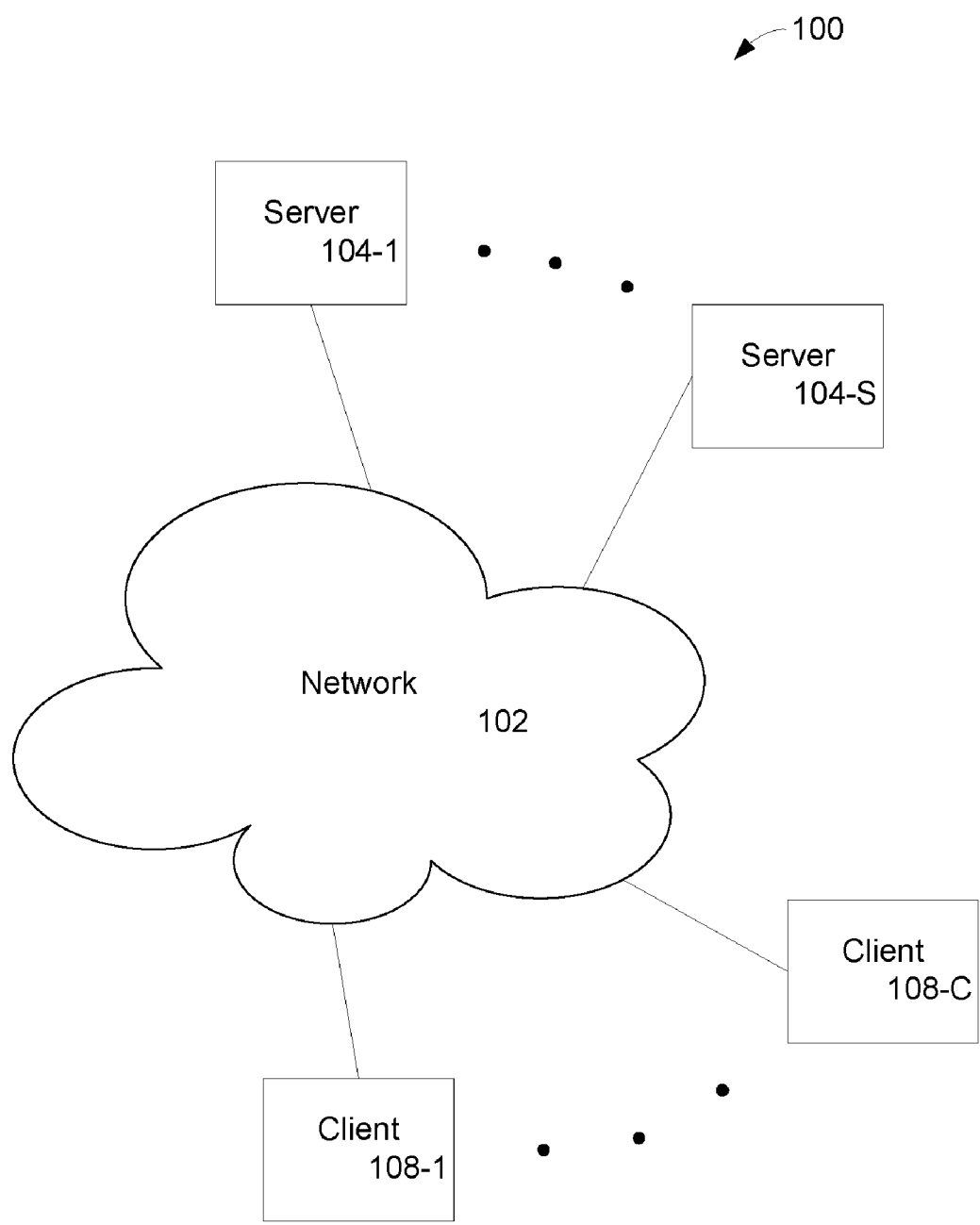
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
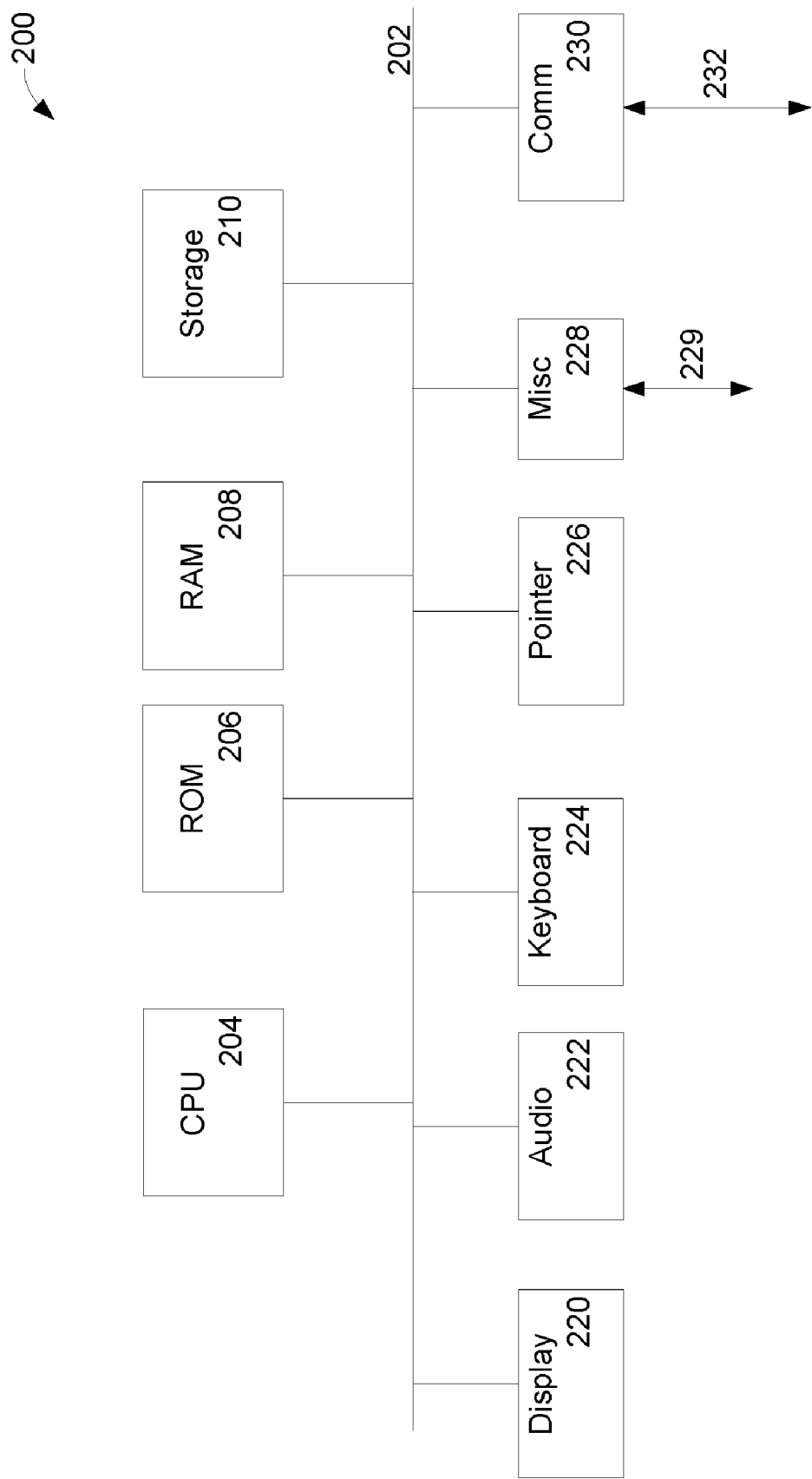
FIG. 2 is a block diagram of a computer system in which some embodiments of the invention may be used.
Figure 3:
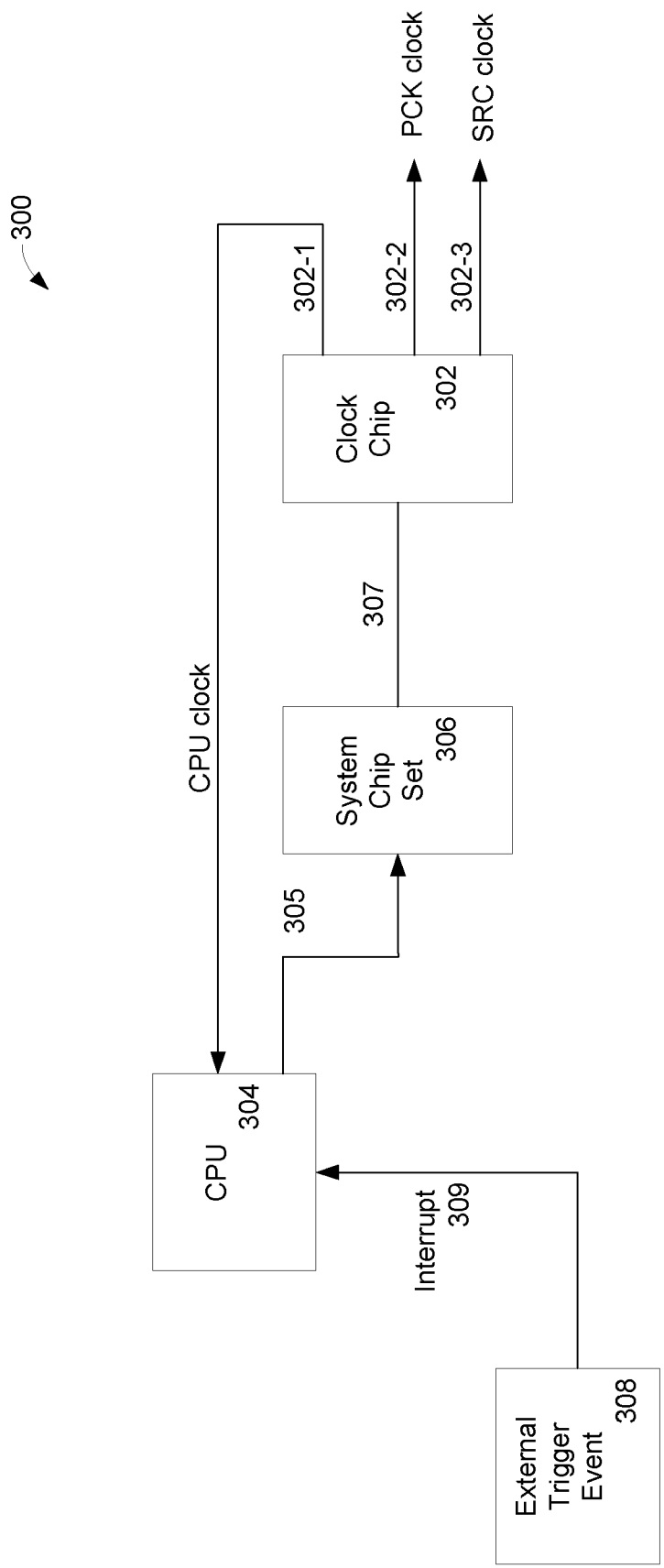
FIG. 3, FIG. 4, and FIG. 5 illustrate several current approaches.
Figure 4:
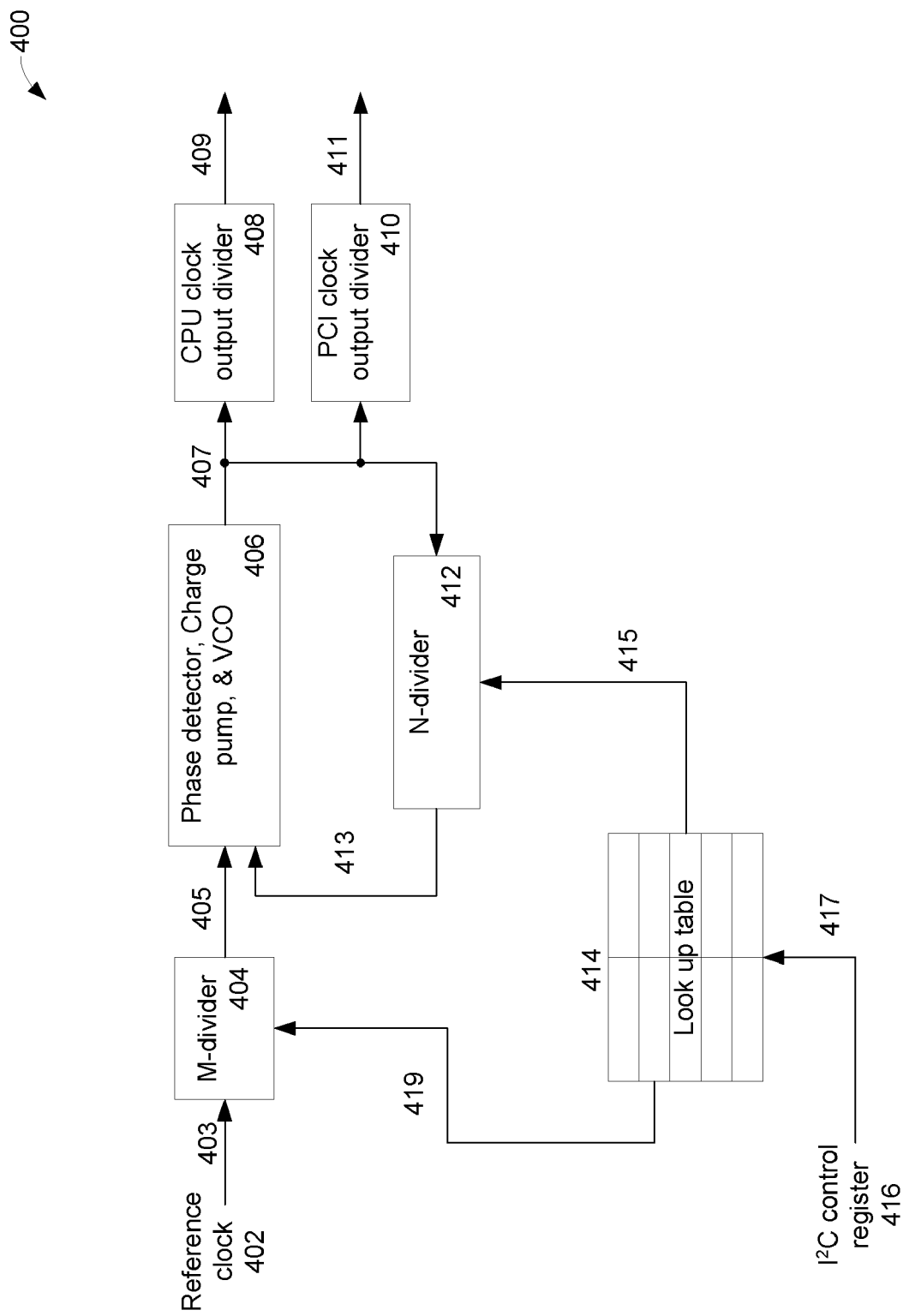
Figure 5:
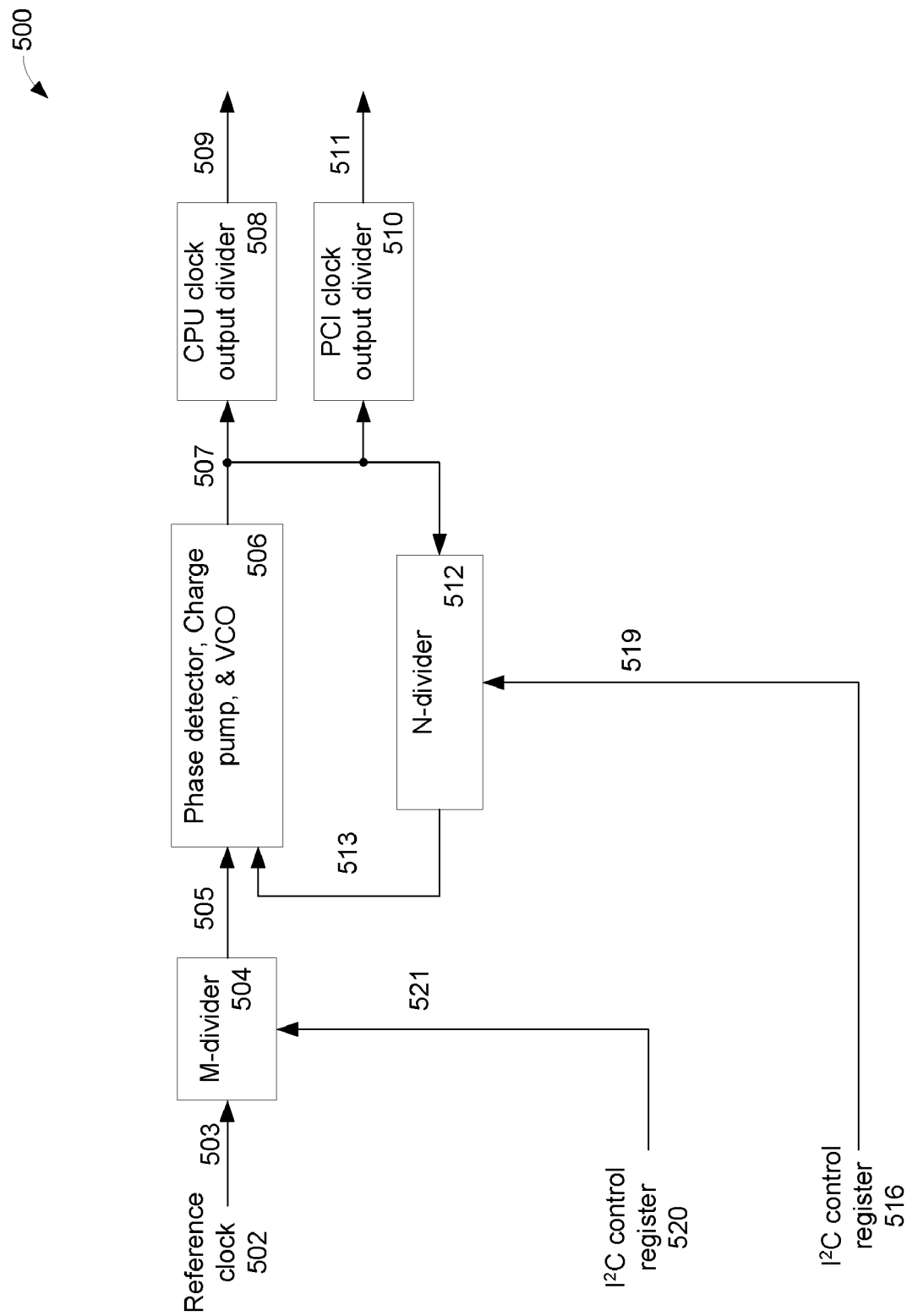

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The servers may represent, for example, disk storage systems alone or storage and computing resources. Likewise, the clients may have computing, storage, and viewing capabilities. The method and apparatus described herein may be applied to essentially any type of visual communicating means or device whether local or remote such as a LAN, a WAN, a system bus, etc. Thus, the invention may find application at both the S servers 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for clock generation have been described.

What is claimed is:

1. A clock generator comprising:
   a first source of clock parameters having an output;
   a second source of clock parameters having an output;
   a selection circuit having a first input, a second input, a selection input, and an output, said first input coupled to receive said first source output, said second input coupled to receive said second source output, and said output capable of being coupled to one or more circuits; and
   an input capable of receiving an input signal and coupled to said selection input.

2. The clock generator of claim 1 further comprising:
   an input capable of receiving an analog signal;
   an analog to digital (A/D) converter having an input and an output, said input coupled to receive said analog signal; and
   said A/D output coupled to said selection input.

3. The clock generator of claim 1 further comprising:
   four or more independent phase lock loops (PLLs) each PLL capable of generating independent clock signals.

4. The clock generator of claim 1 further comprising:
   a frequency generation block having a signal input, a feedback input, and an output;
   a first divider circuit having an input and an output, said input capable of receiving a reference clock, and said output coupled to said frequency generation block signal input;
   a second divider circuit having an input and an output, said input coupled to said frequency generation block signal output, and said output coupled to said frequency generation block signal feedback input; and
   a third divider circuit having an input and an output, said input coupled to receive said frequency generation block signal output, and said output capable of being coupled to a destination.

5. The clock generator of claim 4 wherein said one or more circuits are selected from the group consisting of said first divider circuit, said second divider circuit and said third divider circuit.

* * * * *